United States Patent
Oku

[11] Patent Number: 6,147,509
[45] Date of Patent: Nov. 14, 2000

[54] SEMICONDUCTOR LOGICAL DEVICE CAPABLE OF CIRCUIT SWITCHING WITHOUT BEING INFLUENCED BY TRANSITIONAL EFFECTS

[75] Inventor: Setsuya Oku, Shiga, Japan

[73] Assignee: NEC Corporation, Tokyo, Japan

[21] Appl. No.: 09/140,654

[22] Filed: Aug. 26, 1998

[30] Foreign Application Priority Data

Aug. 27, 1997 [JP] Japan .................................. 9-231148

[51] Int. Cl.[7] .................................................... G06F 7/38
[52] U.S. Cl. .............................................. 326/39; 326/38
[58] Field of Search ................... 326/38, 39, 40, 326/41

[56] References Cited

U.S. PATENT DOCUMENTS

| | | | |
|---|---|---|---|
| 5,381,058 | 1/1995 | Britton et al. | 326/41 |
| 5,838,167 | 11/1998 | Erickson et al. | 326/38 |
| 5,969,543 | 10/1999 | Erickson et al. | 326/83 |

*Primary Examiner*—Michael Tokar
*Assistant Examiner*—Anh Tran
*Attorney, Agent, or Firm*—Sughrue, Mion, Zinn, Macpeak & Seas, PLLC

[57] ABSTRACT

An FPGA is provided with a plurality of logic circuits and memories. By transmitting logic circuit information to the memories of the logic circuits which are not operating, and switching to the logic circuits which are operating when the transmission is completed, the FPGA is capable of operating such that there is no operational transmission period.

15 Claims, 12 Drawing Sheets

SEMICONDUCTOR LOGICAL DEVICE CAPABLE OF CIRCUIT SWITCHING WITHOUT BEING INFLUENCED BY TRANSITIONAL EFFECTS

BACKGROUND OF THE INVENTION

The present invention relates to a logic circuit which is capable of changing from outside a memory which comprises a flip-flop and an electrically writable memory element or an electrically erasable memory element. In particular, the present invention relates to a semiconductor logical device which is generally referred to as a field programmable gate array (i.e. FPGA).

DESCRIPTION OF THE RELATED ART

According to an FPGA as shown in FIG. 1, a setting for the logic circuit is made possible by a memory element. As for the memory element, a volatile memory element (RAM), a writable and unerasable non-volatile memory element (PROM), a writable and erasable non-volatile memory element (EPROM), or an electrically writable and erasable memory element (EEPROM) is used.

As illustrated in FIG. 2A, the logic circuit is a circuit array which takes a circuit comprising a pattern generator 7, multiplexers 6 and 8, and a flip-flop 5, as its minimum structure, each circuit having its logic determined according to information from the memory.

As shown in FIG. 2B, an input/output circuit comprises flip-flops 41 and 42, a multiplexer 8, and buffers 39 and 43. The input/output circuit is responsible of maintaining the input and output signals and for the driving. Here, terminal functions are determined according to information from the memory.

With respect to conventional applications of the FPGA, the FPGA has been used on electronics which are made to have their functions altered in the future, or it has been used in such cases where circuit alterations are frequently required in the process of designing. Conventionally, the FPGAs are made to carry out circuit changes under conditions that the concerned electronic is in a state of being stopped, or in a special state in which a circuit change is possible. However, there has been no such FPGA which is capable of conducting a circuit change in a real time basis, that is while the concerned electronic is operating. Thus, the conventional FPGAs are only capable of taking advantage of a function in which a circuit renewal is possible by transferring logic circuit information without having to change the hardware.

As to an FPGA employing a RAM, there are ways for a circuit change such as connecting a non-volatile memory element (ROM) to the outside of the FPGA so as to transfer the logic circuit information thereto, or connecting to a computer so as to transfer the logic circuit information thereto to make use of it. A process of circuit changing with respect to a time based order is ① terminating the operation of an old circuit, ② transferring information of a new circuit, ③ waiting during a transitional period for the circuit change, and finally ④ operating the new circuit.

As to an FPGA employing an EEPROM, the FPGA is capable of storing the logic circuit information inside the FPGA, and erasing and writing the circuit information from outside at a time of a circuit change. A process of circuit changing with respect to a time based order is ① terminating the operation of an old circuit, ② erasing the old stored information, ③ writing information on the new circuit, and finally ④ operating the new circuit.

With respect to the above FPGA employing the RAM, the circuit operation must be stopped while the logic circuit information is being transferred, and during the transitional period. Likewise, regarding the above FPGA employing the EEPROM, the operation must be stopped while the logic circuit information is being erased or written, and during the transitional period.

Concerning the conventional FPGAs, the first problem has to do with the period in which the logic circuit information is transferred as in the case of the FPGA using the RAM, and the period in which the logic circuit information is erased and written as in the case of the FPGA using the EEPROM. The nature of the above problem is that while transferring or writing the information, the logic circuit of the FPGA becomes indefinite, by which the circuit operation has to be terminated, making it difficult to carry out consecutive controls. In order to simplify the explanation to follow, the transfer period of the logic circuit information with respect to the FPGA employing the RAM, and the erasing and writing period with respect to the FPGA employing the EEPROM, are all referred to as a transfer period. The transfer period varies depending on the way of transferring, the size of the circuit which the FPGA is capable of holding, and the way of constructing the circuit. As to one example, transmitting 8 Kb of logic circuit information with a 20 MHz clock by a series transmission would take about 400 μs of time with respect to an approximate 6000-gate scale FPGA. Even in case of conducting a transmission by an application of an 8 bit parallel transmission, it would take about 50 μs, and the operation of the FPGA has to be stopped during this time. When it comes to a 50-kilogate scale FPGA, the operation has to be stopped for about 3 to 4 ms when a series transmission is applied.

The second problem with respect to the conventional FPGAs is transitional fluctuations of output signals at a time of circuit switching. Even in changing the circuit information to that having the same output state, as long as the circuit structure of the FPGA is in the process of changing, you cannot avoid having the output logic become indefinite. This is due to the fact that the FPGA is operating under a system in which signal line connections of the internal flip-flop and the pattern generator are determined according to the logic circuit information, and thus a transitional unstableness is generated due to differences of change operation periods among logic parts for controlling. In addition, an initial setting circuit as well as a certain period of time are needed for setting the state of the flip-flop, by which the output becomes unstable during the initial setting. A period of time set for avoiding transitional fluctuations (i.e. transitional period) has to be about 100 ns, although it depends on the design of the FPGA itself.

The third problem with respect to the conventional FPGAs has to do with a case when a time-division circuit change is required, in which the same circuit is used repeatedly. In this case, when the circuit information of the memory is already rewritten on a different circuit, the logic circuit information has to be written on the memory section through the circuit information control section. When this happens, the logic circuit is to be initialized, and it would be impossible to inherit the transitional state of the former logic circuit.

The fourth problem with respect to the conventional FPGAs is the timing of the circuit change, which is determined by analyzing the circumstances of the inside and the outside of the logic circuit, so as to conduct a circuit switch with such timing which would not influence the inputs and outputs. As to a way of neglecting this timing, the logic circuit which conducts a series of operations can be divided into several sections within a certain cycle, so that it can link inputs and outputs as being a more complicated logic circuit. However, this idea is not very practical because signal delays etc. can be generated due to a fixed-period time-division, unnecessary circuit changes can be constantly generated, and increase of power dissipation can be expected.

SUMMARY OF THE INVENTION

The present invention has been achieved with such points in mind, and it is therefore an object of the present invention to resolve the problems relating to the logic circuit information transmission period by arranging a plurality of logic circuits and memories, so as to transfer the logic circuit information to the memory belonging to the logic circuit which is not operating at the moment, and switching to the one in use after the transmission is completed, by which the transmission period can be cut off in the operation.

According to the present invention, by separating the input/output circuit section from the logic circuit, and constructing the input/output circuit section with an exclusive memory, it is possible to prevent transitional output fluctuations at a time of circuit switching. The switching of logic circuits is done by selectively connecting the logic circuits through the logic circuit selector section. This should prevent any false operation caused by transitional responses at a time of switching.

The state of the logic circuit which is generated based on the circuit information stored in the memory is of a flip-flop state. By arranging a certain means to relocate the transitional state of the logic circuit to a memory annexed to the circuit information control section, when the previously used circuit is to be revived, it is possible to pass on the state of the circuit without having it initialized at the time when the logic circuit information is written on the memory section through the circuit information control section.

The switching timing is set at the circuit information control section by arranging switching conditions, which makes the switching possible without depending on any external signal. The switching conditions to be designated can be selected from ① a state of the operating logic circuit, ② a state of the input/output circuit, and ③ a selection signal, or can be a possible combination of the above.

Switching of the logic circuits can be done only through a partial change by means of an output logic inversion, rewriting of a particular register bit etc. Accordingly, there are cases in which rewriting of the whole circuit and circuit switching are not necessary. The circuit change is possible by adopting a function of partially rewriting particular logic circuit information, employing the function of setting switching conditions.

BRIEF DESCRIPTION OF THE DRAWINGS

The above and further objects and the novel feature of the invention will more fully appear from the following detailed description when the same is read in connection with the accompanying drawings, in which.

DESCRIPTION OF THE PREFERRED EMBODIMENTS

Figure 1:
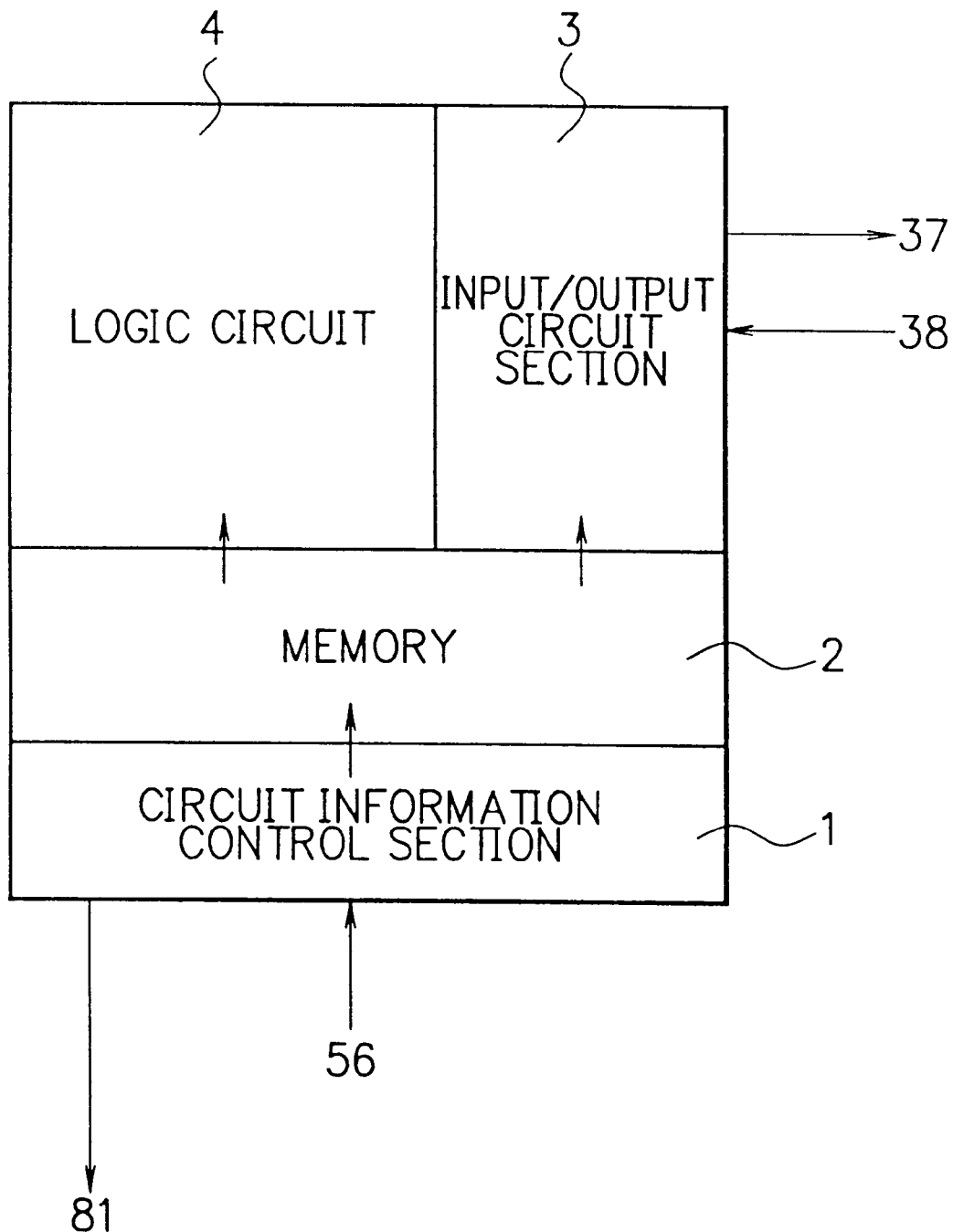
FIG. 1 is a diagram showing a structure of a conventional FPGA.

Referring now to the drawings, a description of preferred embodiments of the present invention will be given in detail.

First of all, a description will be given on a way of operating an FPGA of the present invention as a preferred logic circuit, which comprises two logic circuit sections. The FPGA circuit function is provided by a first logic circuit or a second logic circuit. The logic of each logic circuit is determined by logic circuit information being set for a first memory or a second memory. The logic circuit information is transmitted to each memory from a circuit information control section through a logic circuit selector section. A signal of each logic circuit is connected to an input/output circuit section so as to link a signal input and a signal output to the logic circuit. In this case, the logic circuit to be connected to the signal input and output is selected according to a select signal and an inner signal which is generated when the states of the input/output circuit section and the operating logic circuit fulfill the conditions set at the circuit information control section.

Figure 3:
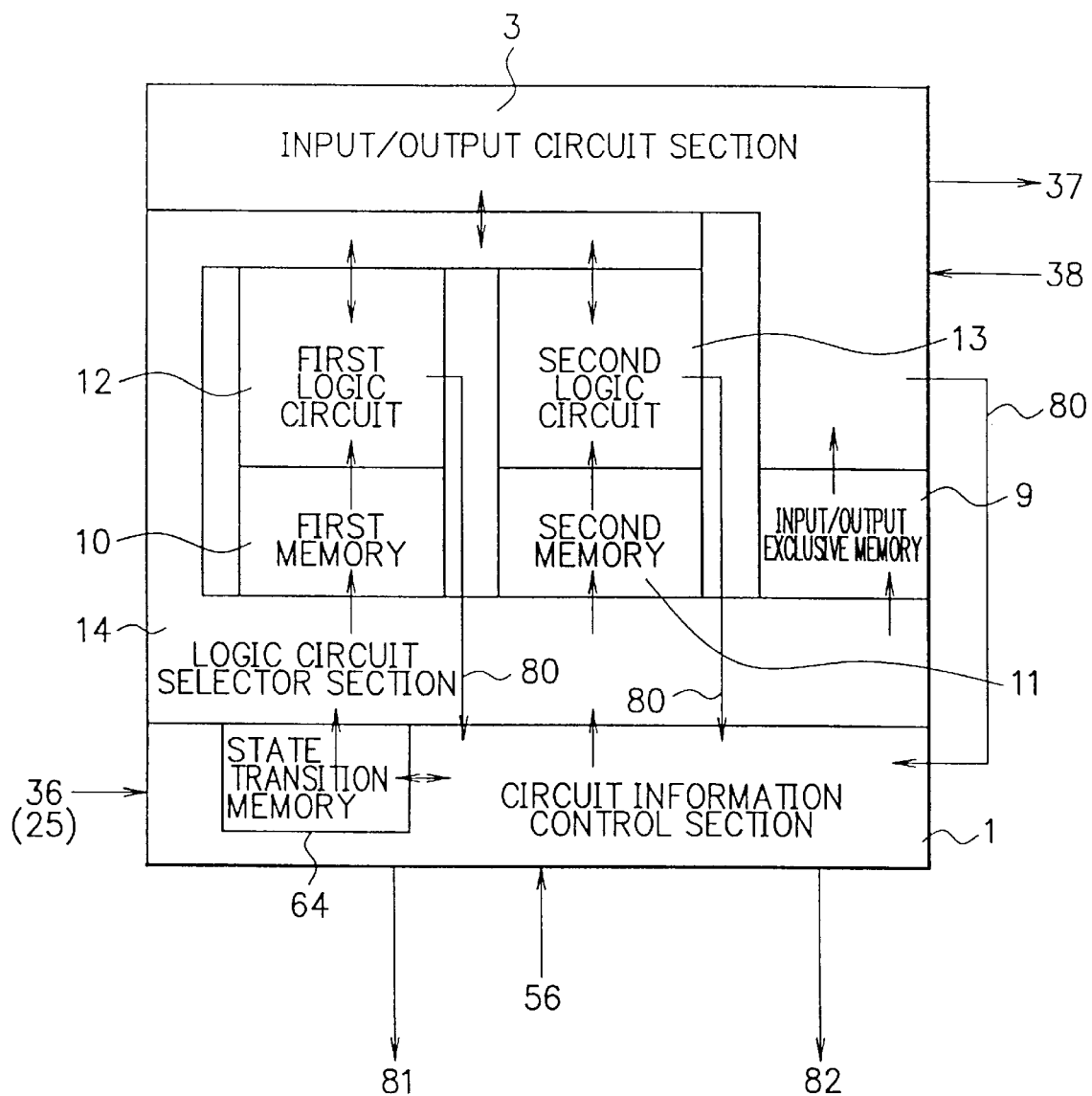
FIG. 3 is a diagram showing a basic structure of the present invention as a first embodiment.

FIG. 3 shows a basic structure of the FPGA as a first embodiment of the present invention. It is shown in a way that it can be easily compared with the conventional FPGA shown in FIG. 1. The FPGA circuit function is given by a first logic circuit 12 or a second logic circuit 13. The logic of each logic circuit is determined by logic circuit information being set for a first memory 10 or a second memory 11. The logic circuit information is transmitted to each memory from a circuit information control section 1 through a logic circuit selector section 14. A signal of each logic circuit is connected to an input/output circuit section 3 through the logic circuit selector section 14 and thus connects a signal input 38 and a signal output 37 to the logic circuit. In this case, the logic circuit to be connected to the signal input 38 and the signal output 37 is selected by the logic circuit selector section 14, under the control of the circuit information control section 1, according to a select signal 36 and an inner signal 80. Thus each logic circuit comprises a programmable logic arrays and wiring means between the arrays, the programmable logic arrays integrating a programmable logic comprising a pattern generator, a flip-flop, and a multiplexer, as in the case of the logic circuit 4 shown in FIG. 1.

Figure 2A:
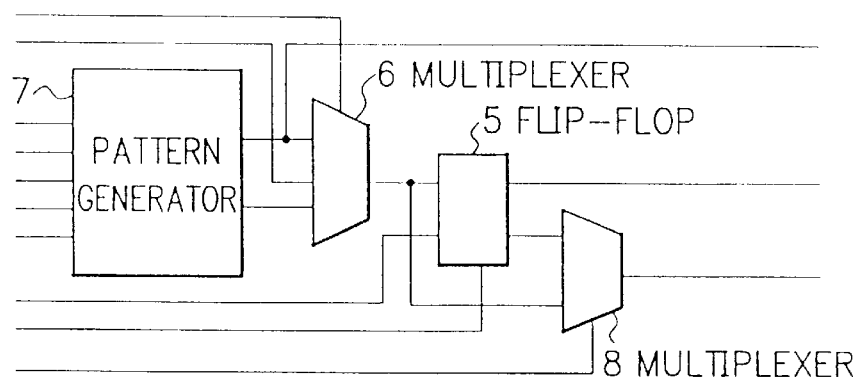
FIG. 2A is a diagram showing an internal structure of a part of a logic circuit.
Figure 2B:
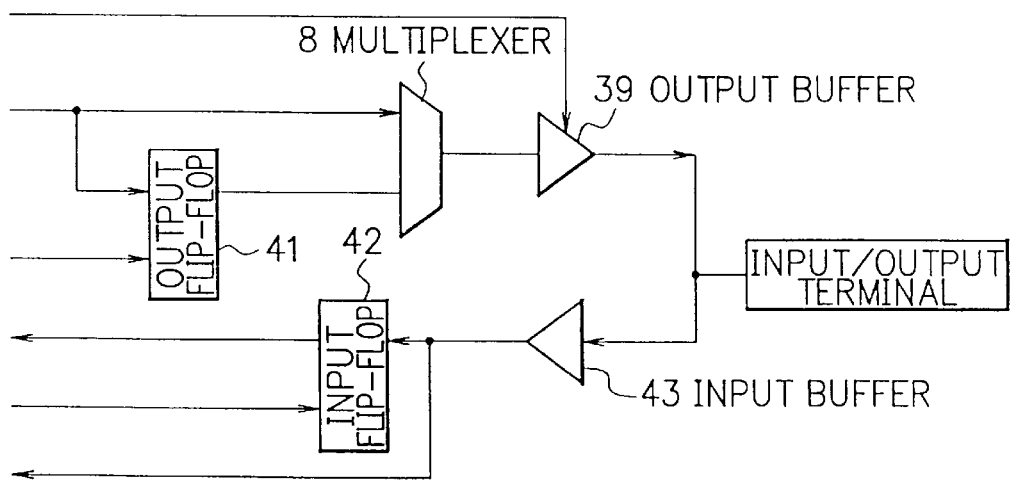
FIG. 2B is a diagram showing an internal structure of a part of an input/output circuit section.

As already explained in the conventional case, the programmable logic being the basic minimal element of the logic circuit is shown in FIG. 2A. The memory shown in FIG. 3 serves to provide wirings among parameters of the pattern generator, a state of the flip-flop, a state of the multiplexer, and the programmable logic. As shown in FIG. 2B, the input/output circuit section comprises an output buffer 39, a multiplexer 8, an output flip-flop 41, an input buffer 43, and an input flip-flop 42, provided for each terminal, enabling the setting of terminal functions.

As illustrated in FIG. 3, according to the FPGA of the present invention, the input/output circuit section 3, has an input/output exclusive memory 9 which is constructed separately from the other memories. This structure is provided in a way that it will not cast any negative influence over the inputs and outputs at a time of circuit changing. There might be cases in which logic circuit information 56 is outputted from a control apparatus such as a microcomputer, but usually it is connected to a ROM. A read-out of circuit information from the ROM is driven by an information control signal 81 which is outputted from the circuit information control section 1.

Figure 4:
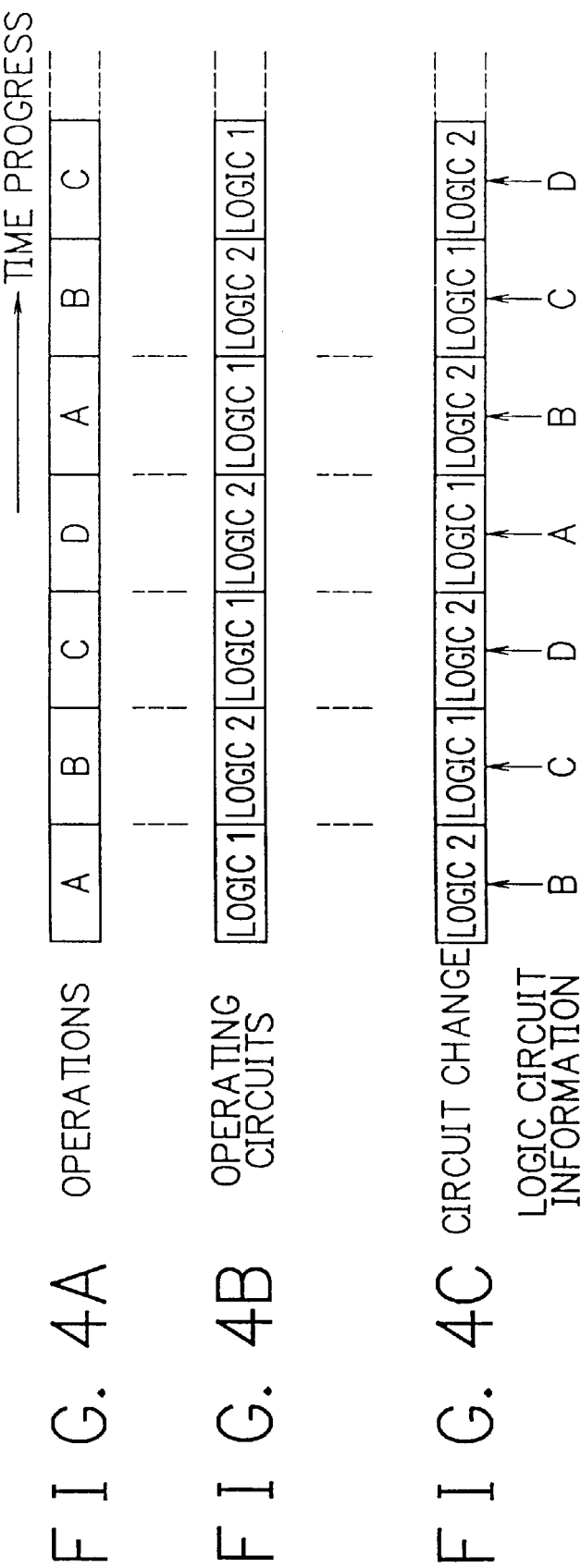
FIG. 4A is one among three diagrams explaining an operation of the FPGA shown in FIG. 3.
FIG. 4B is another one among three diagrams explaining an operation of the FPGA shown in FIG. 3.
FIG. 4C is still another one among three diagrams explaining an operation of the FPGA shown in FIG. 3.

Next, a description will be given on a circuit change which is one feature of the present invention. Here, as shown in FIG. 4A, it is assumed that a functional analysis is conducted over one logic circuit giving a result that four operations A, B, C and D are repeated. While it is either one of the two logic circuits that is functioning, a change of circuit information is possible. In FIG. 4B, a state of the operating logic circuit is shown according to a lapse of time, while a state of a logic information transmission to be carried out at the same timing is shown in FIG. 4C. The logic circuit information is transferred at a time right before the operation, and tie logic circuit is switched right after a lapse of a transitional unstable period accompanying the transmission and the circuit change. Thus, although the FPGA has only two logic circuits, it can operate as if it has four circuits A, B, C and D.

Figure 5:
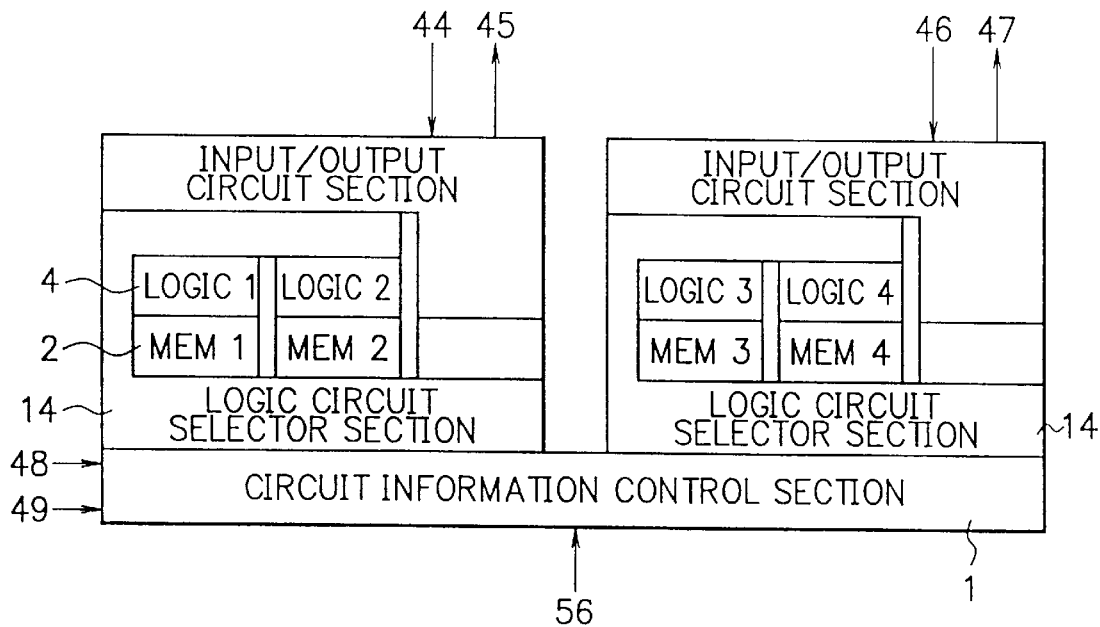
FIG. 5 is a diagram showing one example of the first embodiment of the present invention.

The FPGA of the present invention can employ a structure shown in FIG. 3 as its fundamental structure, and at the same time employ a structure shown in FIG. 5. FIG. 5 is an example in which a number of basic circuits as shown in FIG. 3 are employed.

Figure 6:
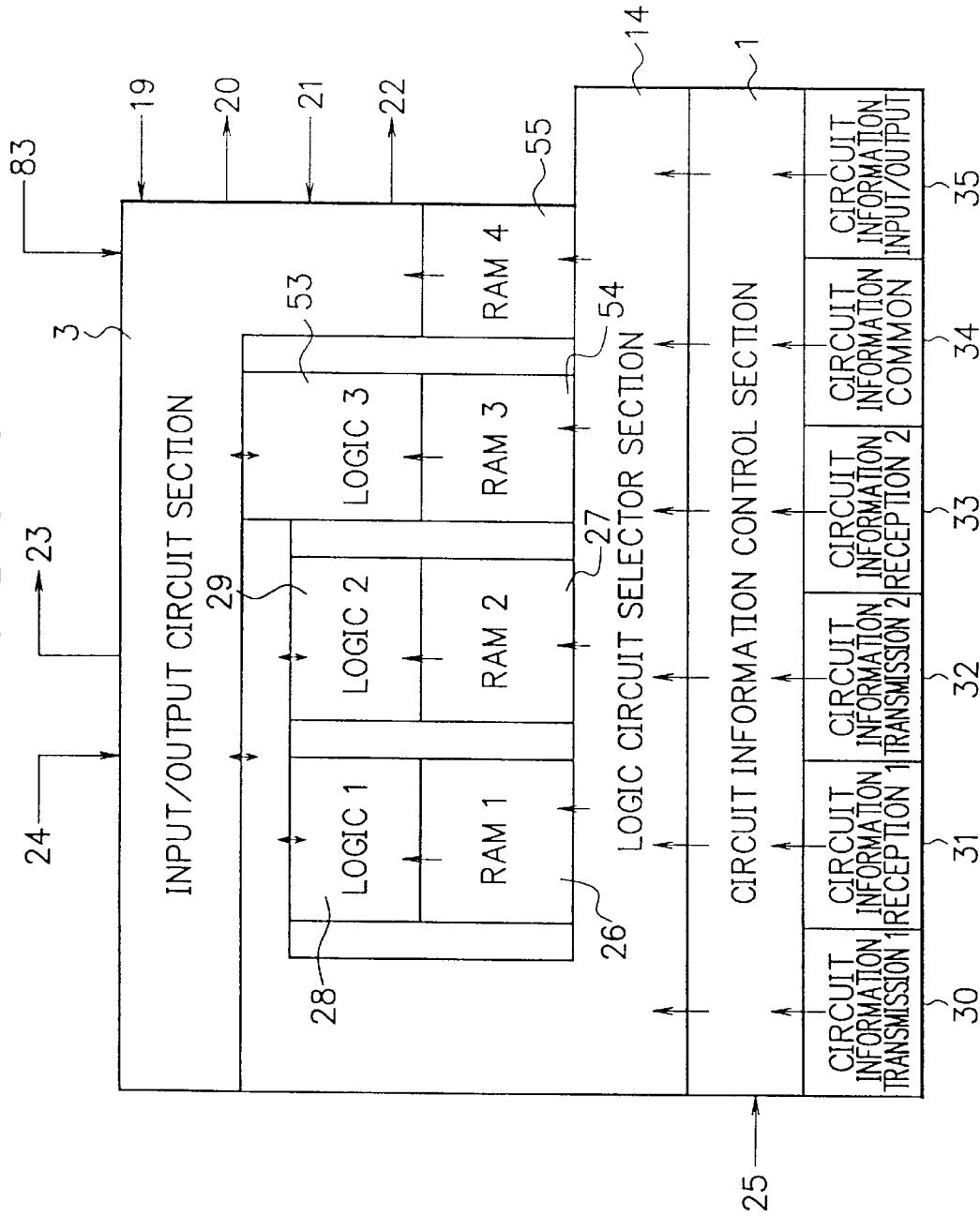
FIG. 6 is a diagram showing another basic structure of the present invention as a second embodiment.
Figure 7:
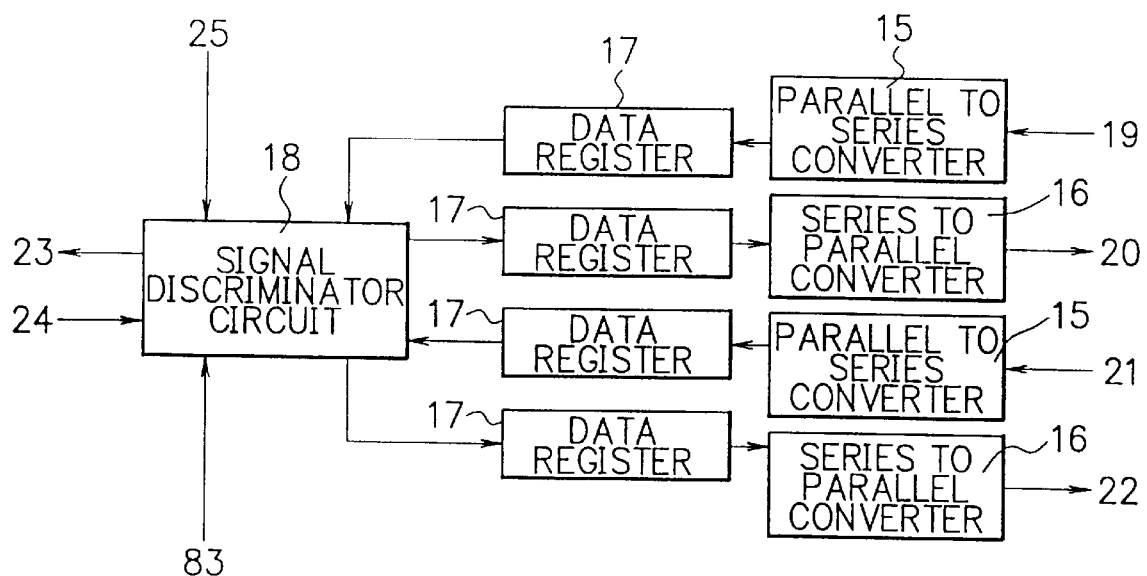
FIG. 7 is a diagram showing one example of the second embodiment of the present invention.

As one example of the application of the FPGA structure shown in FIG. 6, a TDMA (time division multi-channel access) interface circuit for a full-dual series communication is shown in FIG. 7. This is a circuit which conducts series conversion over dual system parallel data so as to transmit and receive the data by time division. This circuit comprises two parallel to series converters 15, two series to parallel converters 16, four data registers 17 for temporary storing the series data, and a signal discriminator circuit 18 for distributing a series signal to each data register according to a synchronizing signal 25.

As to the operation of the circuit shown in FIG. 7, a parallel transmit signal 19 or 21 is converted into series data by the parallel to series converter so as to have it stored in the data register. Then the series data being converted from the parallel transmit signal 19 or 21 is to be outputted from the signal discriminator circuit 18 as a series transmission signal 23 at timing determined by a frame synchronizing signal 25 which is in synchronization with the timing (timing slot) shown in FIG. 8A. A series reception signal 24 is inputted to a corresponding data register as data being taken out at the signal discrimination circuit 18 at timing designated by a frame synchronizing signal 25 which is in synchronization with time division timing (timing slot) shown in FIG. 8A. The data inputted to the data register 17 is converted to parallel data by a series to parallel converter 16, so as to be outputted as parallel reception signal 20 or 22.

FIG. 6 shows a second embodiment of the present invention in which PROMs or ROMs are connected to the FPGA structure shown in FIG. 3. This FPGA comprises ROMs 30 to 35, an information control section 1, a logic circuit selector section 14, four memories 26, 27, 54 and 55, three logic circuits 28, 29 and 53, and an input/output circuit section 3. The logic circuits 28 and 29 are selectively connected to the input/output circuit section 3 through the logic circuit selector section 14. The logic circuit 53 is directly connected to the input/output circuit section 3. Each logic circuit and the input/output circuit section 3 has a memory provided exclusively for its own. The memories are connected to the logic circuit selection section 14.

Figure 8:
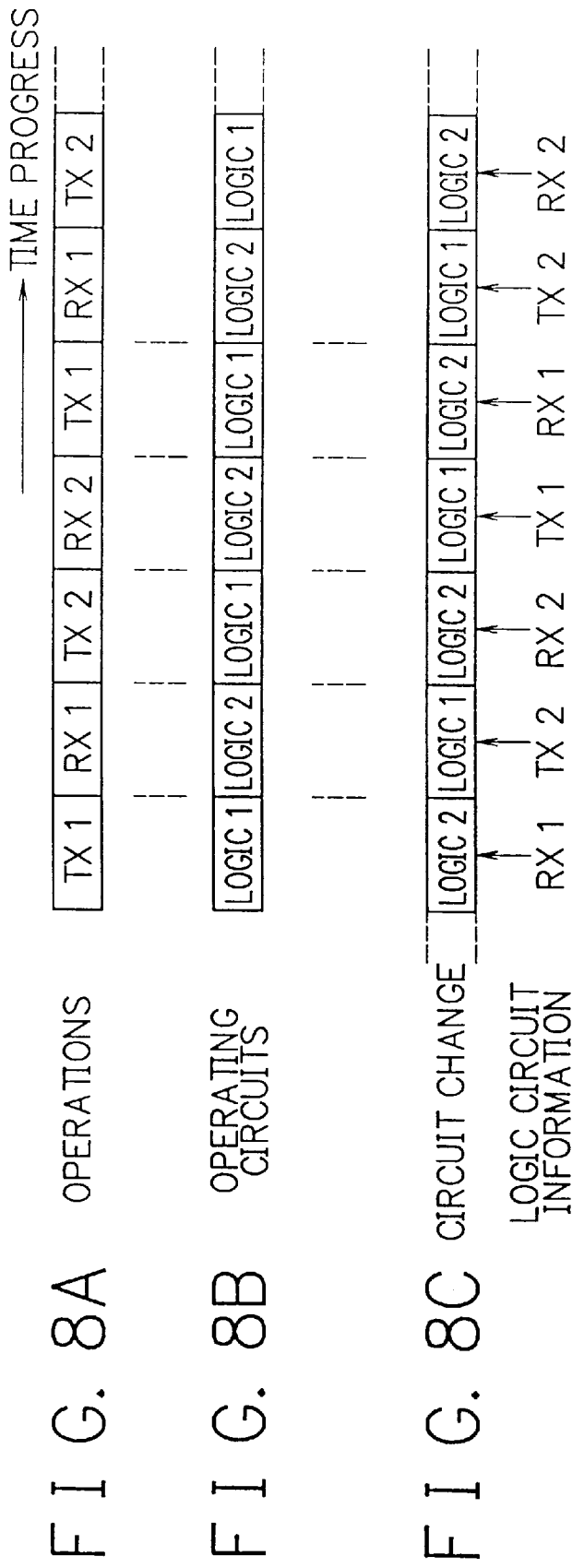
FIG. 8A is one among three diagrams explaining an operation of the FPGA shown in FIG. 6.
FIG. 8B is another one among three diagrams explaining an operation of the FPGA shown in FIG. 6.
FIG. 8C is still another one among thee diagrams explaining an operation of the FPGA shown in FIG. 6.
Figure 9:
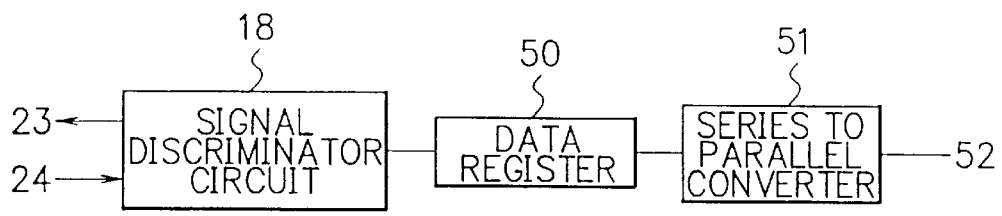
FIG. 9 is a diagram showing a functional development of the circuit shown in FIG. 7.

Now in analyzing the operations of the FPGA as described with reference to FIGS. 7 and 8B, referring to FIG. 9, a data register 50 and a series to parallel converter 51 would not operate at the same time. That is, with respect to the circuit shown in FIG. 7, in catching one certain moment, only one fourth of the constituent circuits are operating. Accordingly, it is possible to construct a circuit having the same function when the data register and the series to parallel converter are changed at the same timing shown in FIG. 8A.

With respect to the FPGA shown in FIG. 6, the series to parallel circuit, the data register and the signal discriminator circuit are made possible by a logic circuit 28 or 29. Each logic circuit can change its logic by changing the circuit information of a memory 26 or 27. In order to realize the operation as shown in FIG. 8A, the logic circuits are to be switched as shown in FIG. 8B. The logic to be provided by each logic circuit is transferred as logic information to the corresponding memory among ROMs 30 to 33 shown in FIG. 6, while the logic circuit is not operating. A part which is constructed by a logic circuit 53 and a memory 54 is connected to the input/output circuit section 3 without having to pass through the logic circuit selector section 14. This part is provided so as to obtain a common logic circuit which is not influenced by the switching of the logic circuit. The logic circuit information of a ROM 34 is transmitted to the memory 54, and the logic circuit information of a ROM 35 is transmitted to the memory 55, via the logic circuit selector section 14 respectively, only once when the power is turned on or when the FPGA is being initialized. The pieces of information from the ROM 34 and 35 are not supposed to be transmitted to the other changeable memories (26, 27).

With respect to the circuit shown in FIG. 7, the signal discriminator circuit 18 is commonly necessary on the time basis. In FIG. 6, the common logic circuit information is stored in ROM 34, and is to be transferred to the memory 54 at an initial stage such as a power supply etc. By separating the common section for implementing the input/output setting and the circuits to be switched, it is possible to reduce the amount of logic circuit information to be transmitted, and thus changing the circuits within a shorter period of time. With respect to signals of the logic circuits which carry out the switch operation, the input/output circuit section 3 is to maintain the signal outputs and receive the signal inputs during the switching, so as to prevent any false operation induced by transitional effects occurring at a time of switching. The logic circuit selector section 14 has a function of receiving one piece of information among the information stored in ROMs 30 to 35 through the circuit information control section 1, so as to distribute it to the memory of a transmit destination and at the same time, selectively connecting the logic circuit to be operated to the input/output circuit section 3.

Figure 10:
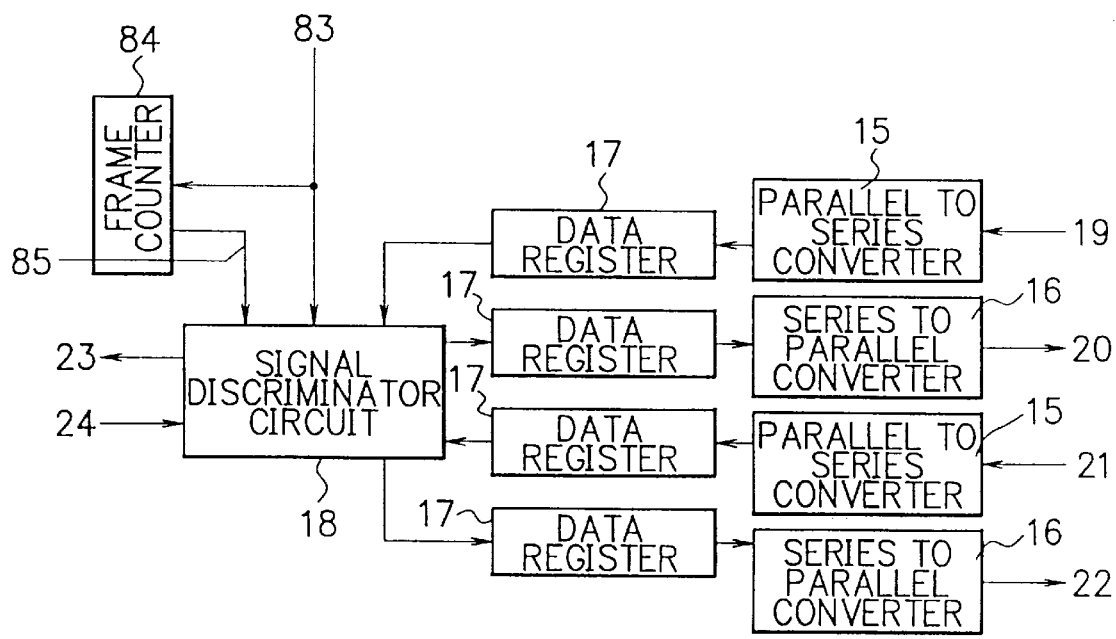
FIG. 10 is a diagram showing another example of the second embodiment of the invention.

In FIG. 6, it is assumed that the frame synchronizing signal 25 is given as time-division timing. Therefore, in switching the logic circuit, the synchronizing signal should be inputted to an external select signal terminal, and a pulse polarity and a select signal designation should be set as switching conditions. However, in case when the frame synchronizing signal 25 is not given, but a bit synchronizing signal 83 is, a frame counter 84 which generates a frame synchronizing signal 85 has to be built in, as shown in FIG. 10. Likewise, it happens frequently that the signals for switching the circuit have to be generated within the FPGA.

Figure 11:
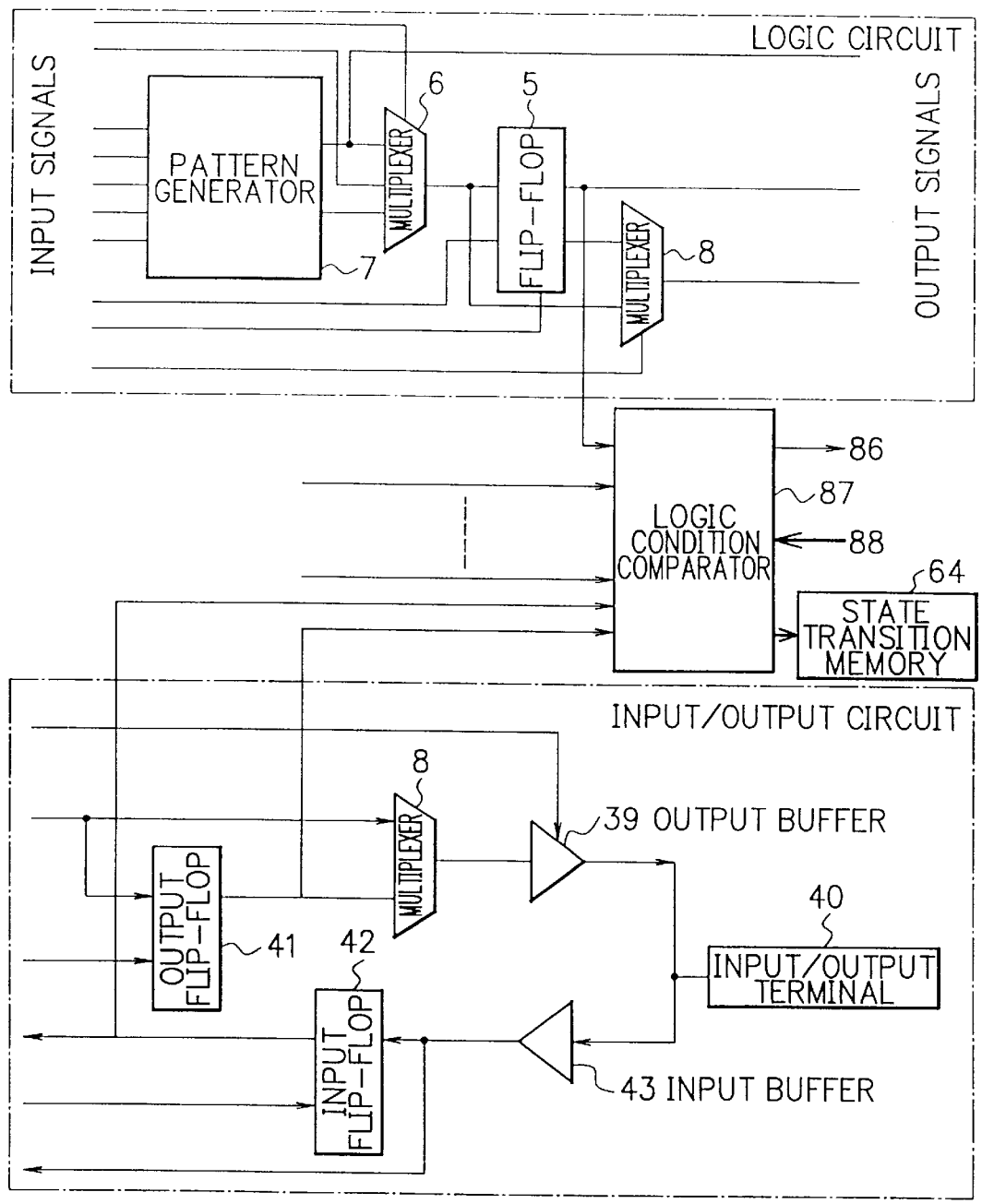
FIG. 11 is a diagram showing the internal structures of the logic circuit and the input/output circuit and the relationship between the two.

FIG. 11 shows a structure of a logic condition comparator 87 which is provided inside the circuit information control section 1. The logic condition comparator 87 is capable of detecting the time when the signal is generated inside and a particular state of the input/output terminal, and internally generating a logic circuit switch signal. When a comparing condition 88 which designates the timing for the logic circuit to be switched is given, a logic circuit switch signal 86 is internally generated at a moment when the logic of the output signal of the flip-flop coincides with the condition. Consequently, the logic circuit is switched, and at the same time, the switching timing is outputted outside the FPGA as a switch complete signal 82 so that it would be possible to take synchronization with an external device such as a microcomputer etc. The comparing condition 88 is attached to the logic circuit information to be given to the logic condition comparator 87 of the circuit information control section.

As with the case of four data registers 17 shown in FIG. 10, there are problems such that internal data might be lost in the process of rewriting the logic circuit. In case of trying to prevent the flip-flop from being initialized by transferring the circuit information stored in the ROMs, it is possible to store the former logic state in a state transition memory 64 shown in FIGS. 11 and 12 so that the former logic state can be reused.

Figure 12:
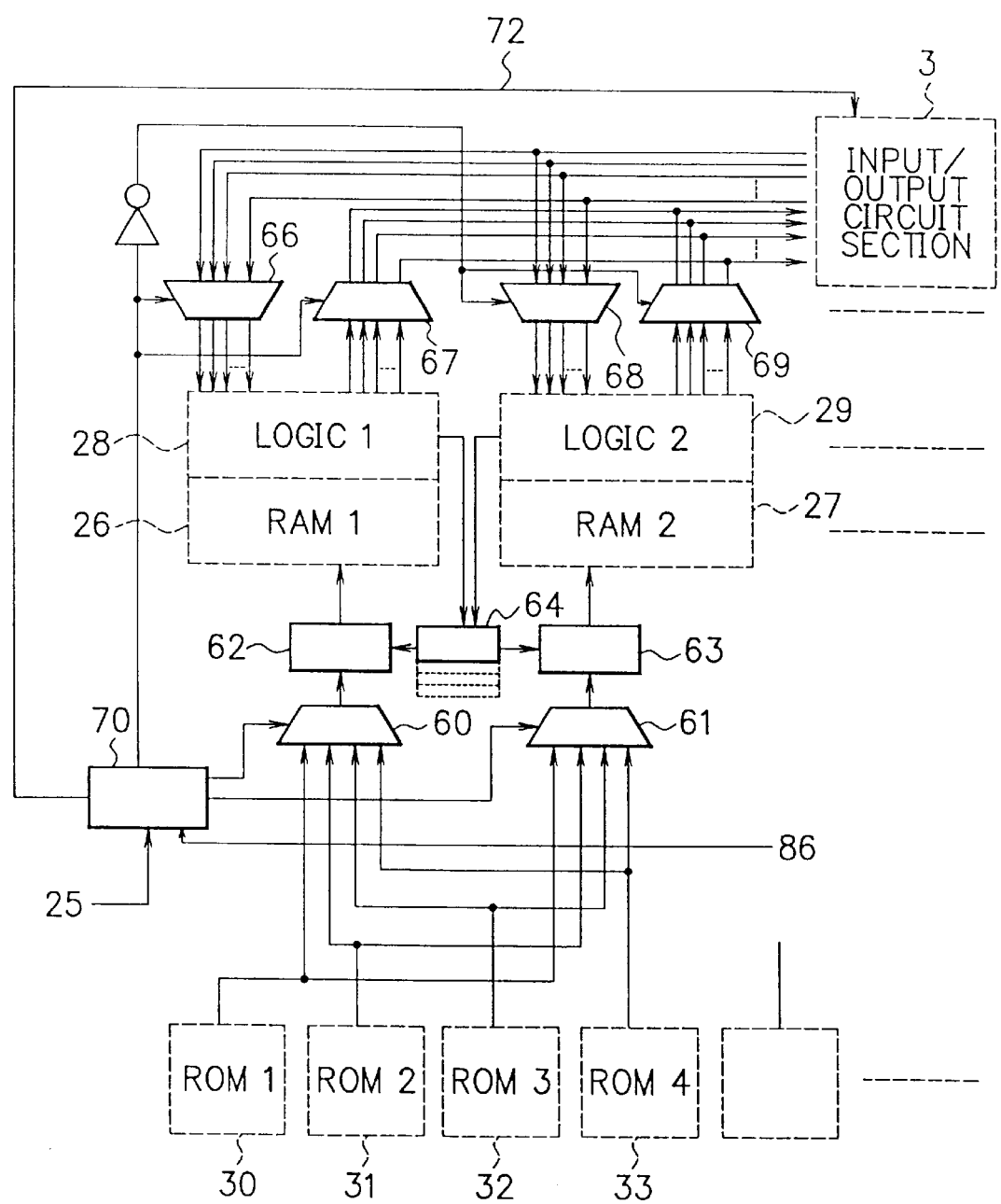
FIG. 12 is a diagram showing the internal structure of the FPGA shown in FIG. 6.

FIG. 12 shows an example in which the circuit is divided in four. Within the circuit information control section 1, four state transition memories 64 are provided. The state transition memory 64 which corresponds to the ROM from which the information is transmitted is being referred to by transmit information registers 62 or 63 shown in FIG. 12, and information designating the state of the flip-flop is to be added to the information held by the state transition memory and then be set to the memory. The state transition memory 64 is to have a state of each logic circuit copied thereto at a time when the operation is stopped, and thus keeps record of the state when the operation is last terminated. Consequently, it is possible to pass over the state of the circuit without having to give any consideration to which logic circuit is being used.

Figure 13:
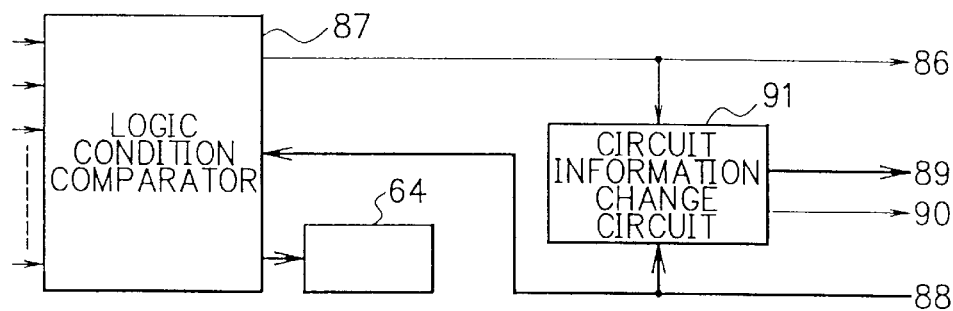
FIG. 13 is a diagram showing still another example of the second embodiment of the invention.

The logic circuit switch signal 86 of the logic condition comparator 87 shown in FIG. 11 can also be used as a signal for rewriting the contents of a particular address of the memory as indicated in FIG. 13. By having the address and the logic superimposed on the comparison condition 88, thus having the address and the write logic of the memory being designated to a circuit information change circuit 91 in advance, an address signal 89 and a data/write signal 90 are generated by which the circuit information of the memory is changed. This sort of a function is useful in case when there is only a little and partial change required. In addition, it is also useful in cases when circuits are added or deleted each time when the logic circuit is switched.

FIG. 12 is a diagram explaining the circuit change operation of the logic circuit selector 14 shown in FIG. 6. All pieces of information stored in the ROMs 30 to 33 are to have their transmit destinations selected by the multiplexer 60 or 61 so as to be transmitted to the memory 26 or 27. Since the ROMs 34 and 35 do not transmit information to the memories 26 and 27, they are not connected to the multiplexer. Each multiplexer is controlled by a select control circuit 70. The circuit switch is operated by the synchronizing signal 25 or the logic circuit switch signal 86. The select control circuit 70 is to transmit from the ROM the logic circuit information to one of the memories (26 or 27) which is not being used at the moment, at timing of the logic circuit switch signal or the synchronizing signal. Further, it switches the connection to the logic circuit and the input/output circuit section 3 in the same manner, and transmits an output change prohibition signal 72 during transitional fluctuations so that the output of the input/output circuit section 3 is not changed because of the transitional fluctuations due to the switching process.

According to the FPGA of the present invention, the scales of the plural logic circuit sections each of which comprises memories and logic circuits do not have to be all the same in their sizes, but each can have a size suitable for its application. However, as shown in FIG. 3, for the input/output circuit section 3 and the logic circuit selector section 14 are common, the number of input and output signals should be less than the maximum number of inputs and outputs which are held by the input/output circuit section 3 and the logic circuit selector section 14, even when the circuit scales are large. Further, in case when the scales of the circuit sections are about the same, there should be no need for using the whole area which is capable of becoming circuits. In use, it is rather normal that a size of the logic circuit information 56 to be used should become different in its size at each division.

The FPGA of the present invention has a function of automatically generating the timing for changing the logic circuits. When this function is used, it is possible to have such operations as software processing by a microcomputer be realized by a hardware. In order to carry out a branch process by condition judging, at least three logic circuits are needed.

Figure 14:
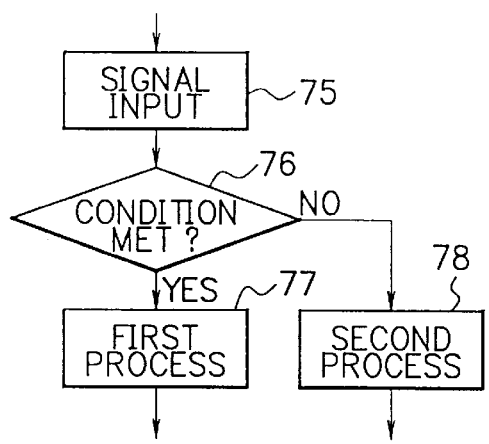
FIG. 14 is a diagram explaining an operation of the FPGA of the first embodiment of the invention.
Figure 15:
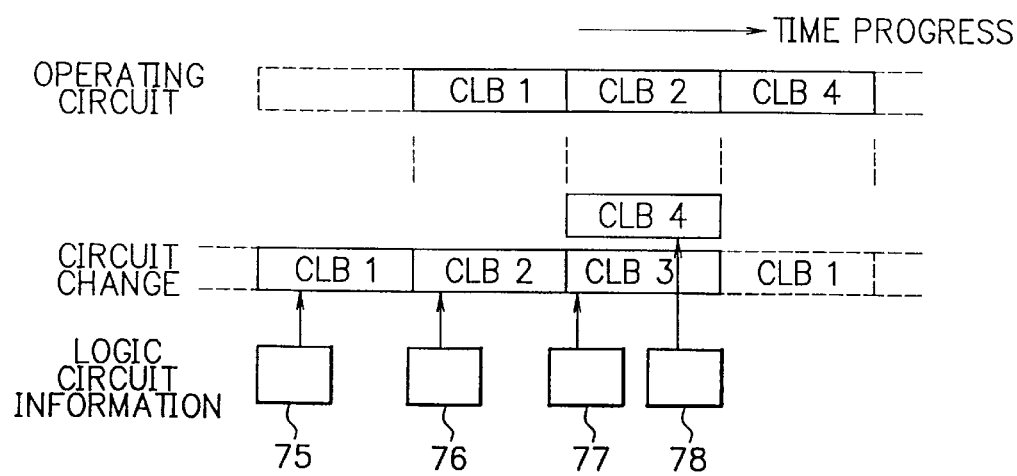
FIG. 15 is another diagram explaining an operation of the FPGA of the first embodiment of the invention.

Now, with reference to FIGS. 5, 14 and 15, an outline of the above statement concerning branch processing will be given. FIG. 14 is a simplified example of a condition judging process. FIG. 15 is a diagram explaining the logic circuit change in accordance with the condition judging. Reference numbers given to pieces of logic circuit information shown in FIG. 15 realize a number of processes indicated by the same numbers shown in FIG. 14. Those numbers also indicate the transmission timing. The indication of "operating logic circuits" in FIG. 15 explains a case of condition disagreement (NO) in FIG. 14.

In FIG. 15, first of all, signal-input logic circuit information 75 is transferred to a logic circuit LOGIC1. While a logic circuit LOGIC1 is operating, condition agreement logic circuit information 76 is transferred to a logic circuit LOGIC2. While a logic circuit LOGIC2 is operating, a first process logic circuit information 77 is transferred to a logic circuit LOGIC3 and at the same time second process logic circuit information 78 is transmitted to a logic circuit LOGIC4.

Provided that the operating logic circuit does not fulfill the predetermined conditions, the logic circuit LOGIC2 instructs the logic circuit selector section to designate the second process logic circuit LOGIC4 as the next logic circuit to operate. Then the logic circuit LOGIC4 as the second process logic circuit starts operating. What should be noted here is that before judging the conditions, the logic circuit information of a branch destination as a result has to be transmitted, which requires several pieces of logic circuit information of branch destinations to be transmitted in advance. However, with respect to a program of a stored program system, it is common that functions of branch destinations are previously determined, and it would not be an obstacle in any respect. Moreover, for a great amount of logic circuit information to be transmitted at a time of condition judging, there should normally be some time basis precautions made. However, in case of using an external ROM, the circuit information control section should be capable of a series transmission rather than a parallel transmission, and driving two ROMs rather than a single ROM, by which it is possible to eliminate the limitations imposed by the transmission period.

The first effect of the present invention is that a larger scale of logic circuit can be acquired with a limited semiconductor device, as compared with the conventional case, by rewriting the operation of the logic circuit. Thus, a cost per circuit can be reduced to a great extent. Further, with respect to the semiconductor logical device of the present invention, it is not only energy saving that is possible, but also circuit recycling, since the invention is rewritable. Owing to this, the invention is also capable of contributing to maintaining and protecting the environment.

The second effect of the present invention is that condition judging, complicated logic operation and such can be dealt with by a high-speed circuit in hardware.

The third effect of the present invention is that the FPGA itself is mainly constructed by memories, which proves that it has a semiconductor pattern with a minimum structure, and that it can have its scale easily enlarged, resulting in a profitable mass production of the semiconductor devices.

Further, by having the structure shown in FIG. 3 as a fundamental block, and connecting a number of such blocks as shown in FIG. 5, it is possible to construct a larger and a highly efficient FPGA. This will facilitate the process of the designing of the semiconductor device, further induce the mass production, and give an advantage such that the FPGA is easily designed by a repetition of basic maneuvers.

In addition, according to the present invention, the semiconductor logical device is capable of being used in other applications, and owing to the expanded range of applications resulting from the first and the second effects as described above, a further effect can be obtained with respect to the mass production of the devices.

While preferred embodiments of the invention have been described using specific terms, such description is for illustrative purposes only, and it is to be understood that changes and variations may be made without departing from the spirit or the scope of the following claims.

What is claimed is:

1. A semiconductor logical device comprising:
    a plurality of logic circuits and programmable memories, each logic circuit coupled to one of the programmable memories, each programmable memory storing logic circuit information to program the coupled logic circuit with logical functions;
    an input/output circuit, selectively coupled to said plurality of logic circuits, for maintaining signal input to, and signal output from, one or more of said plurality of logic circuits, said input/output circuit having an exclusive memory circuit preventing transitional fluctuations at a time of switching;
    a circuit information control section, through which logic circuit information is written to said plurality of programmable memory; and
    a logic circuit selector, coupled to said input/output circuit and being operable to connect and disconnect said input/output circuit from one logic circuit to another logic circuit when the input/output circuit section and/or one of the plurality of logic circuits meet a predetermined condition,
    wherein any of said logic circuits disconnected from said input/output circuit is available for reprogramming, while any logic circuits connected to said input/output circuit continue to operate.

2. A semiconductor logical device according to claim 1, wherein:
    the plurality of logic circuits and programmable memories are organized as a plurality of logic circuit sections, each section comprising a portion of the plurality of logic circuits and programmable memories, wherein each logic circuit section disconnected from said input/output circuit is available for reprogramming, while any logic circuit sections connected to said input/output circuit continue to operate.

3. A semiconductor logical device according to claim 1, further comprising:
    a change means for changing logic information of one of the programmable memories.

4. A semiconductor logical device according to claim 2, further comprising:
    a change means for changing logical information of the programmable memories of one of the logic circuit sections.

5. The semiconductor logical device according to claim 1, wherein said predetermined condition is based on a logic condition of said input/output circuit.

6. The semiconductor logical device according to claim 1, wherein said predetermined condition is based on a logic condition of said circuit information control section.

7. The semiconductor logical device according to claim 1, wherein said predetermined condition is based on a logic condition of said any logic circuits connected to said input/output circuit.

8. A semiconductor logical device comprising:
    a first logic section comprising a first logic circuit coupled to a first memory, said first memory storing logic circuit information to program said first logic circuit to perform at least one logic function;
    a second logic section comprising a second logic circuit coupled to a second memory, said second memory storing logic circuit information to program said second logic circuit to perform at least one logic function;

a circuit information control section, selectively coupled to one of the logic sections and through which logic circuit information is loaded into the first memory and the second memory;

a logic circuit selector, toggling between said first logic section and said second logic section each time a predetermined condition occurs, alternately coupling one logic section to an input/output circuit, while coupling the other logic section to said circuit information control section; and the input/output circuit including an exclusive memory, coupling the selectively coupled logic section to logic signals input into, and output from, said semiconductor logical device, and maintaining said signals.

9. The semiconductor logical device according to claim 8, further comprising a change means coupled to said circuit information control section and providing a plurality of logic functions for programming the first and second logic sections.

10. The semiconductor logical device according to claim 8, wherein:

said first logic section further comprises a third logic circuit coupled to a third memory, said third memory storing logic circuit information to program said third logic circuit to perform at least one logic function; and said second logic section further comprises a fourth logic circuit coupled to a fourth memory, said fourth memory storing logic circuit information to program said fourth logic circuit to perform at least one logic function.

11. The semiconductor logical device according to claim 10, further comprising a change means coupled to said circuit information control section and providing a plurality of logic functions for programming the first and second logic sections.

12. The semiconductor logical device according to claim 8, wherein said predetermined condition is based on a logic condition of said input/output circuit.

13. The semiconductor logical device according to claim 8, wherein said predetermined condition is based on a logic condition of said circuit information control section.

14. The semiconductor logical device according to claim 8, wherein said predetermined condition is based on a logic condition of said first logic section.

15. The semiconductor logical device according to claim 8, wherein said predetermined condition is based on a logic condition of said second logic section.

* * * * *